US012602520B2

(12) United States Patent

Mankowski et al.

(10) Patent No.: US 12,602,520 B2

(45) Date of Patent: Apr. 14, 2026

(54) MACHINE-LEARNING VIRTUALIZATION-ENABLED HARVESTING

(71) Applicant: 4AG Robotics Inc., Salmon Arm (CA)

(72) Inventors: Peter Mankowski, Vernon (CA); Vijaya Sankar Velayudham Jayashree, Salmon Arm (CA); Nathan Tomlinson, Enderby (CA)

(73) Assignee: 4AG Robotics Inc., Salmon Arm (CA)

( * ) Notice: Subject to any disclaimer, the term of this patent is extended or adjusted under 35 U.S.C. 154(b) by 0 days.

(21) Appl. No.: 18/929,229

(22) Filed: Oct. 28, 2024

(65) Prior Publication Data

US 2025/0139317 A1 May 1, 2025

Related U.S. Application Data

(60) Provisional application No. 63/594,171, filed on Oct. 30, 2023.

(51) Int. Cl.
*G06F 30/13* (2020.01)
*A01G 18/69* (2018.01)
*A01G 18/70* (2018.01)

(52) U.S. Cl.
CPC ............. *G06F 30/13* (2020.01); *A01G 18/69* (2018.02); *A01G 18/70* (2018.02)

(58) Field of Classification Search
CPC .......... G06F 30/13; A01G 18/69; A01G 18/70
See application file for complete search history.

(56) References Cited

U.S. PATENT DOCUMENTS

| | | |
|---|---|---|
| 2,853,333 A | 9/1958 | Littell |
| 2,940,713 A | 6/1960 | Van Dusen |

(Continued)

FOREIGN PATENT DOCUMENTS

| | | |
|---|---|---|
| CA | 2041824 A1 | 11/1991 |
| CA | 3111952 A1 | 9/2022 |

(Continued)

OTHER PUBLICATIONS

Sujatanagarjuna A, Kia S, Briechle DF, Leiding B. MushR: A Smart, Automated, and Scalable Indoor Harvesting System for Gourmet Mushrooms. Agriculture. 2023; 13(8):1533. (Year: 2023).*

(Continued)

*Primary Examiner* — Larry D Riggs, II
*Assistant Examiner* — Emilie A Smith
(74) *Attorney, Agent, or Firm* — McKee, Voorhees & Sease, PLC

(57) ABSTRACT

A harvesting program system iteratively generates current harvesting programs for performance by harvesting equipment on a mushroom bed. The system receives current mushroom bed data corresponding to the mushroom bed including growing mushrooms at the current times. The system processes the current mushroom bed data using a mushroom bed model to generate current virtual mushroom beds corresponding to current states of the mushroom bed at the current times. The mushroom bed model is trained using labelled training mushroom bed data including known values of the mushroom bed, and using previously-generated virtual mushroom beds corresponding to predicted states of the mushroom bed. The system generates using the mushroom bed model predicted virtual mushroom beds corresponding to predicted states of the mushroom bed at future times. The system generates current harvesting programs based on the predicted virtual mushroom beds, and transmits them performance by the harvesting equipment on the mushroom bed.

15 Claims, 6 Drawing Sheets

(56) References Cited

U.S. PATENT DOCUMENTS

| | | | |
|---|---|---|---|
| 3,183,640 | A | 5/1965 | Gee et al. |
| 3,537,495 | A | 11/1970 | Pearson |
| 3,568,959 | A | 3/1971 | Blaff |
| 3,635,005 | A | 1/1972 | Persson |
| 3,765,408 | A | 10/1973 | Kawai |
| 4,453,755 | A | 6/1984 | Blatt et al. |
| 4,472,929 | A | 9/1984 | MacCanna et al. |
| 4,519,193 | A | 5/1985 | Yoshida et al. |
| 4,545,186 | A | 10/1985 | MacCanna |
| 4,600,229 | A | 7/1986 | Oten |
| 4,768,919 | A | 9/1988 | Borgman et al. |
| 4,828,306 | A | 5/1989 | Blatt |
| 4,852,926 | A | 8/1989 | Littell |
| 4,883,939 | A | 11/1989 | Sagi |
| 4,975,016 | A | 12/1990 | Pellenc et al. |
| 5,035,109 | A | 7/1991 | Van Den Top |
| 5,058,368 | A | 10/1991 | Wheeler |
| 5,185,989 | A | 2/1993 | Russell et al. |
| 5,201,560 | A | 4/1993 | Golden |
| 5,234,375 | A | 8/1993 | Hendriks |
| 5,344,202 | A | 9/1994 | Ramler et al. |
| 5,471,827 | A | 12/1995 | Janssen et al. |
| 5,491,965 | A | 2/1996 | Wheeler et al. |
| 5,935,136 | A | 8/1999 | Hulse et al. |
| 7,185,603 | B2 | 3/2007 | Correa et al. |
| 7,204,792 | B2 | 4/2007 | Hagihara et al. |
| 7,207,609 | B2 | 4/2007 | Ilich |
| 7,280,890 | B2 | 10/2007 | Seemann |
| 7,281,739 | B2 | 10/2007 | Kniss |
| 7,309,089 | B2 | 12/2007 | Perlman et al. |
| 7,665,783 | B2 | 2/2010 | Nishio |
| 7,854,108 | B2 | 12/2010 | Koselka et al. |
| 8,005,570 | B2 | 8/2011 | Gloden et al. |
| 8,033,087 | B2 | 10/2011 | Rapila et al. |
| 9,527,115 | B2 | 12/2016 | Larose et al. |
| 9,623,570 | B1 | 4/2017 | Krahn et al. |
| 9,730,394 | B2 | 8/2017 | Van De Vegte et al. |
| 9,974,235 | B2 | 5/2018 | Van De Vegte et al. |
| 10,654,177 | B2 | 5/2020 | Perlman et al. |
| 10,674,666 | B2 | 6/2020 | Moore |
| 10,681,905 | B2 | 6/2020 | Tanner et al. |
| 10,785,912 | B2 | 9/2020 | Moore |
| 10,814,498 | B2 | 10/2020 | Wagner et al. |
| 10,850,402 | B2 | 12/2020 | Wagner et al. |
| 11,154,010 | B2 | 10/2021 | Good et al. |
| 11,889,789 | B2 | 2/2024 | Glibetic et al. |
| 2005/0268587 | A1 | 12/2005 | McKeown |
| 2009/0188771 | A1 | 7/2009 | Van Den Top |
| 2012/0210553 | A1 | 8/2012 | Chen |
| 2012/0279122 | A1 | 11/2012 | Benne et al. |
| 2013/0115028 | A1 | 5/2013 | Kremerman et al. |
| 2013/0147101 | A1 | 6/2013 | Cho |
| 2013/0149076 | A1 | 6/2013 | Cox et al. |
| 2013/0272823 | A1 | 10/2013 | Hudgens et al. |
| 2013/0340329 | A1 | 12/2013 | Van Den Top |
| 2014/0064886 | A1 | 3/2014 | Toshima |
| 2019/0225485 | A1 | 7/2019 | Ziegler et al. |
| 2019/0240813 | A1 | 8/2019 | Nakayama et al. |
| 2021/0082104 | A1 | 3/2021 | Kashkoush et al. |
| 2021/0158041 | A1 | 5/2021 | Chowdhary et al. |
| 2021/0195853 | A1 | 7/2021 | Barnes et al. |
| 2023/0044563 | A1 | 2/2023 | Boudreau et al. |
| 2023/0081119 | A1 | 3/2023 | Rohanimanesh et al. |
| 2023/0150764 | A1 | 5/2023 | Ruehr |
| 2023/0255153 | A1 | 8/2023 | Counne |
| 2024/0324524 | A1 | 10/2024 | Al-Diri et al. |

FOREIGN PATENT DOCUMENTS

| | | |
|---|---|---|
| CN | 107046933 A | 8/2017 |
| CN | 109081036 A | 12/2018 |
| CN | 108812086 B | 5/2020 |
| CN | 113079954 A | 7/2021 |
| DE | 10335021 B3 | 11/2004 |
| EP | 0596189 A1 | 5/1994 |
| EP | 3081071 A1 | 10/2016 |
| GB | 1336393 A | 11/1973 |
| JP | H0787829 A | 4/1995 |
| JP | H0957213 A | 3/1997 |
| JP | 6300571 B2 | 3/2018 |
| KR | 100926534 B1 | 11/2009 |
| KR | 20210014268 A | 2/2021 |
| KR | 20210035948 A | 4/2021 |
| NL | 8600887 A | 11/1987 |
| WO | 9111902 A1 | 8/1991 |
| WO | 2016171556 A1 | 10/2016 |
| WO | 2020021643 A1 | 1/2020 |
| WO | 2020191483 A1 | 10/2020 |
| WO | 2022243260 A1 | 11/2022 |
| WO | 2023010198 A1 | 2/2023 |

OTHER PUBLICATIONS

International Patent Application No. PCT/CA2024/051244, International Search Report and Written Opinion, dated Feb. 3, 2025.

U.S. Appl. No. 18/512,597, Corrected Notice of Allowance dated Feb. 13, 2025.

U.S. Appl. No. 18/512,597, Notice of Allowance dated Jan. 23, 2025.

U.S. Appl. No. 18/904,925, Non-Final office Action dated Jan. 15, 2025.

European Patent Application No. 21952135.8, Extended European Search Report dated Nov. 13, 2024.

Azoyan, A., "Feasibility Analysis of an Automated Mushroom Harvesting System," 2004, University of Georgia, Master's Thesis, 69 pages.

Cordis EU Project Champi-ON 262037 Report, "Fully Automatic System for Picking and Handling Mushrooms for the Fresh Market: From the Growing Bed to the Cooling Storage," 2013 [retrieved on Feb. 2, 2022]. Retrieved from the Internet: <URL: https://cordis.europa.eu/project/id/262037/reporting>, 5 pages.

Galley, A., "Pneumatic Hyperelastic Robotic End-Effector for Grasping Soft Curved Organic Objects," Electronic Thesis and Dissertation Repository, 2019, the University of Western Ontario, Master's Thesis, 143 pages. Retrieved from the Internet: <URL: https://ir.lib.uwo.ca/etd/6392>.

International Patent Application No. PCT/CA2021/000057, International Preliminary Report on Patentability, dated Feb. 15, 2024, 9 pages.

International Patent Application No. PCT/CA2021/000057, International Search Report and Written Opinion, dated Apr. 25, 2022, 12 pages.

Mushroom Technological Research Center of La Rioja (CTICH) Web page extract (English version), European Projects, Autol (La Rioja) Spain. https://www.ctich.com/.

New Zealand Patent Application No. 808264, Patent Examination Report 1, dated Mar. 5, 2024, 3 pages.

New Zealand Patent Application No. 813080, Patent Examination Report 1, dated Aug. 28, 2024, 3 pages.

Reed, et al., "AE—Automation and Emerging Technologies: Automatic Mushroom Harvester Development," Journal of Agricultural Engineering Research, 2001, vol. 78 (1), pp. 15-23.

Reliability, Safety, and Strength Realized in ATI's New Patent, Innovative Robotic Tool Changer Design, ATI Industrial Automation, 2024, 2 pages.

Screen Capture from YouTube Video Clip entitled: "Champi-ON Demo Video," uploaded on Sep. 17, 2013 by user Champi-ON Project Project. Retrieved from the Internet: <URL: https://www.youtube.com/watch?v=y44MyQ39d00>, 2 pages.

TechBrew, "Changing the Mushroom Harvesting Business," made public by TechBrew Robotics on Apr. 21, 2021 (date verified by Google Wayback Machine). Retrieved from the Internet: <URL: https://web.archive.org/web/20210421150750/https://techbrew.com/mushroom-harvesting-roboV>, 2 pages.

U.S. Appl. No. 18/512,597, Non-Final Office Action, dated Aug. 7, 2024, 13 pages.

U.S. Appl. No. 18/512,597, Notice of Allowance, dated Sep. 11, 2024, 8 pages.

(56)     References Cited

OTHER PUBLICATIONS

International Patent Application No. PCT/CA2024/051246, International Search Report and Written Opinion, dated Dec. 17, 2024.
U.S. Appl. No. 18/512,597, Notice of Allowance dated Dec. 4, 2024.
U.S. Appl. No. 18/512,597, Notice of Allowance dated Nov. 7, 2024.
International Patent Application No. PCT/CA2024/051175, International Search Report and Written Opinion, dated Nov. 8, 2024.
European Patent Application No. 24208682.5, Extended European Search Report dated May 14, 2025.
European Patent Application No. 24208796.3, Extended European Search Report dated Apr. 15, 2025.
European Patent Application No. 24209254.2, Extended European Search Report dated Apr. 15, 2025.
U.S. Appl. No. 18/957,448, Notice of Allowance dated Mar. 5, 2025.
U.S. Appl. No. 19/054,050, Final Office Action dated Oct. 20, 2025.
Canadian Patent Application No. 3,227,180, Examination Report dated Nov. 19, 2025.
European Patent Application No. 24208682.5, Communication Under Rule 71(3) dated Jan. 8, 2026.

* cited by examiner

400
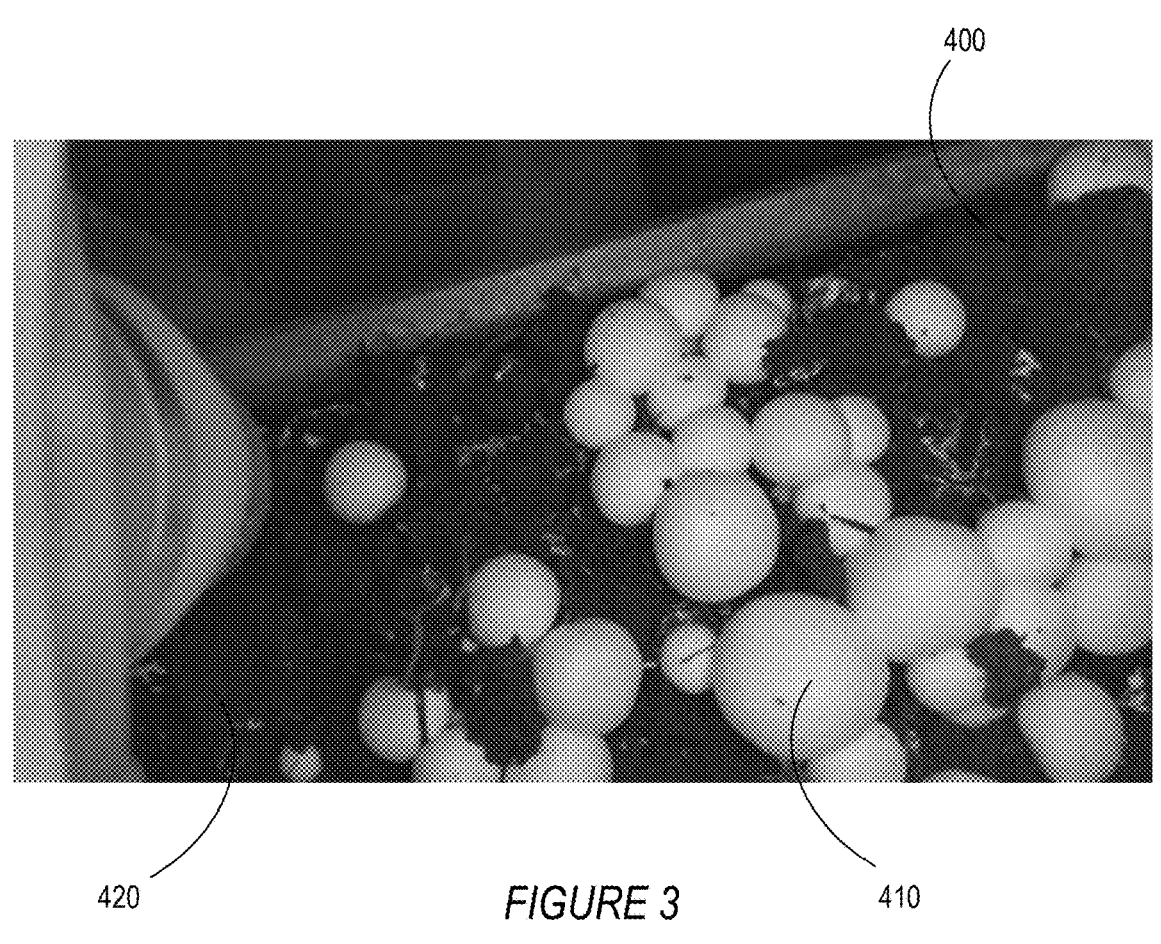
420                 FIGURE 3                 410
420"        400"
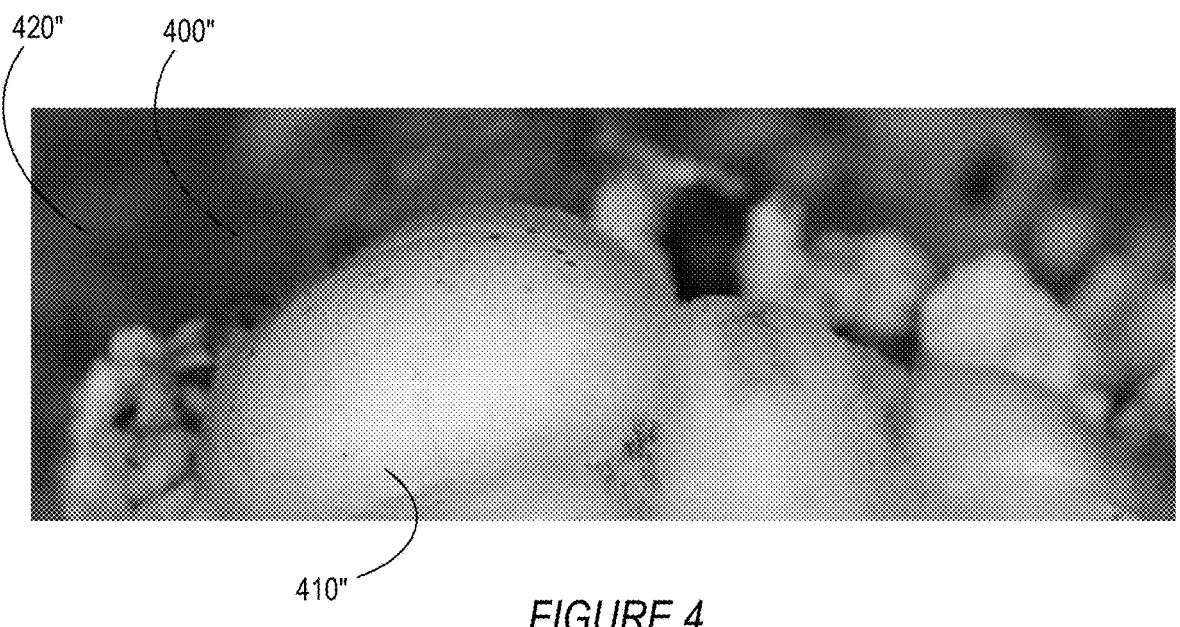
410"
FIGURE 4

500
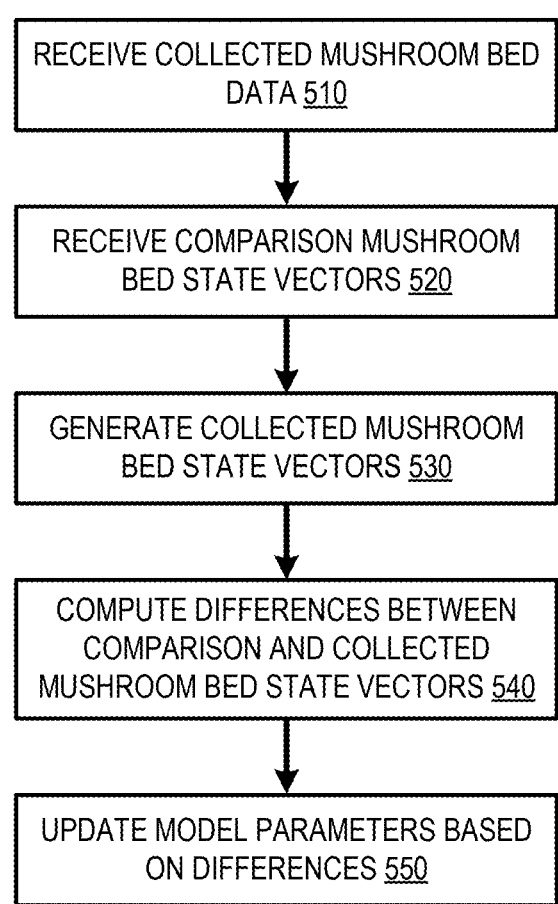
RECEIVE COLLECTED MUSHROOM BED DATA 510
↓
RECEIVE COMPARISON MUSHROOM BED STATE VECTORS 520
↓
GENERATE COLLECTED MUSHROOM BED STATE VECTORS 530
↓
COMPUTE DIFFERENCES BETWEEN COMPARISON AND COLLECTED MUSHROOM BED STATE VECTORS 540
↓
UPDATE MODEL PARAMETERS BASED ON DIFFERENCES 550
*FIGURE 5*

400

400'

420

410

410"

410'

600

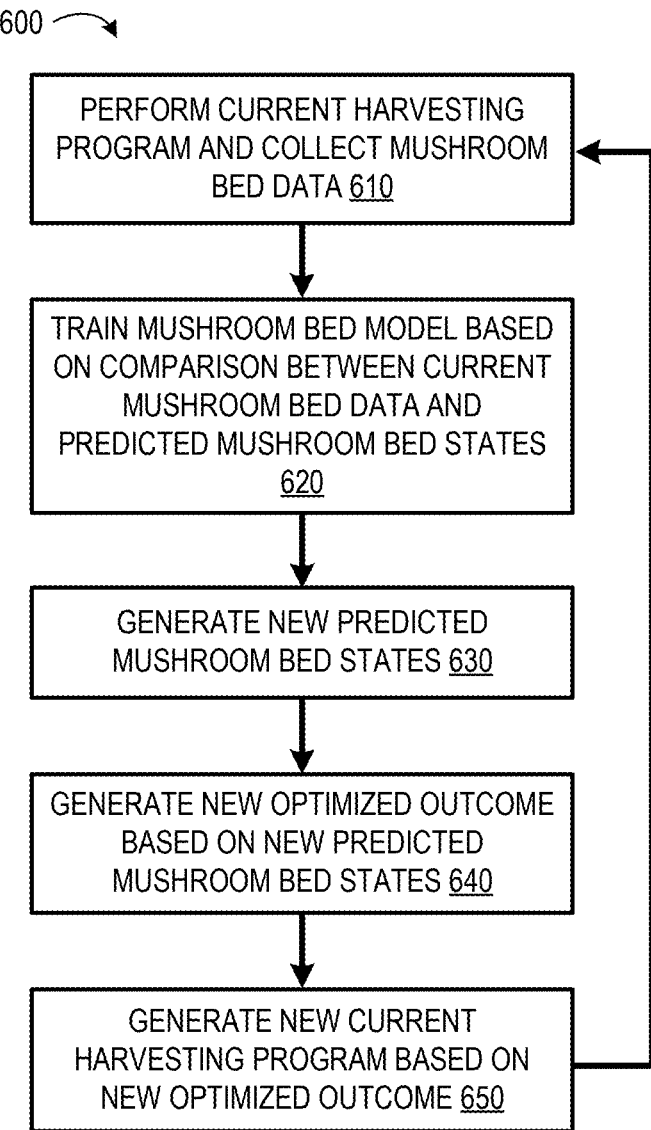

PERFORM CURRENT HARVESTING
PROGRAM AND COLLECT MUSHROOM
BED DATA 610

TRAIN MUSHROOM BED MODEL BASED
ON COMPARISON BETWEEN CURRENT
MUSHROOM BED DATA AND
PREDICTED MUSHROOM BED STATES
620

GENERATE NEW PREDICTED
MUSHROOM BED STATES 630

GENERATE NEW OPTIMIZED OUTCOME
BASED ON NEW PREDICTED
MUSHROOM BED STATES 640

GENERATE NEW CURRENT
HARVESTING PROGRAM BASED ON
NEW OPTIMIZED OUTCOME 650

*FIGURE 7*

MACHINE-LEARNING VIRTUALIZATION-ENABLED HARVESTING

CROSS REFERENCE TO RELATED APPLICATIONS

This application claims priority under 35 U.S.C. § 119 to provisional patent application U.S. Ser. No. 63/594,171, filed Oct. 30, 2023. The provisional patent application is hereby incorporated by reference in its entirety herein, including without limitation: the specification, claims, and abstract, as well as any figures, tables, appendices, or drawings thereof.

FIELD

The present disclosure relates generally to techniques for the cultivation and harvest of agricultural crops, and in particular for the automated cultivation and harvest of mushrooms.

BACKGROUND

In typical commercial mushroom growing operations, mushrooms are grown in growing beds on the surface of casing soil over substrate in a series of weekly intervals called flushes. Each flush is picked several times per day over a five-day period, and typically two to three flushes are harvested. The size at which the mushrooms are picked depends on market requirements.

European and North American commercial production of button mushrooms typically occurs on "Dutch Style" substrate filled shelves, using a two or three flush cropping cycle. The substrate is typically a composted mixture of wheat straw, animal manure, and gypsum. The substrate is pasteurized, inoculated, and colonized with spawn of a selected mushroom strain. The substrate is covered with a casing soil of peat and lime mixture in a layer approximately 45 to 50 mm deep, which is then ruffled with compost added to the casing to mix mushroom mycelium into the casing.

Traditionally, commercial mushroom farm operations rely on manual labour to harvest the mushrooms. Manual labour is costly, however, and difficult to optimize. Mushrooms typically grow at such a rate that the mushrooms approximately double in size every 24 hours. Using manual labour, each flush is picked only two or three times per day for the duration of the flush, meaning that a mushroom bed may become overgrown between pickings due to the growth rate of mushrooms. In order to prevent overgrowth of a mushroom bed, a flush can be picked more frequently, but picking at a higher frequency is difficult and costly to accomplish with manual labour. When a bed becomes overgrown, the mushrooms may run out of room and grow into each other, thereby reducing yield, increasing stem growth, and/or causing deformation of each individual mushroom thereby adversely affecting the quality and value of the harvested mushrooms.

The automated mushroom harvesting apparatus by Bourdeau et al. disclosed in WIPO International Publication Number WO 2023/010198 A1 solves many of the challenges associated with the automated picking of cultivated mushrooms. There remains, therefore, a need for improved techniques to optimize the total yield and overall effectiveness of automated mushroom cultivation and harvest systems which addresses at least some of the shortcomings of previous solutions and provides yet further advantages, thereby providing a material value over prior techniques.

BRIEF DESCRIPTION OF THE DRAWINGS

Embodiments will now be described, by way of example only, with reference to the attached Figures.

FIG. 3 shows an image of an actual mushroom bed.

FIG. 4 shows an image of a synthetic mushroom bed used for training a mushroom bed model.

FIG. 5 shows a flowchart of a method for training a mushroom bed model.

FIG. 7 shows a flowchart of a method for generating a current harvesting program.

Figure 1:
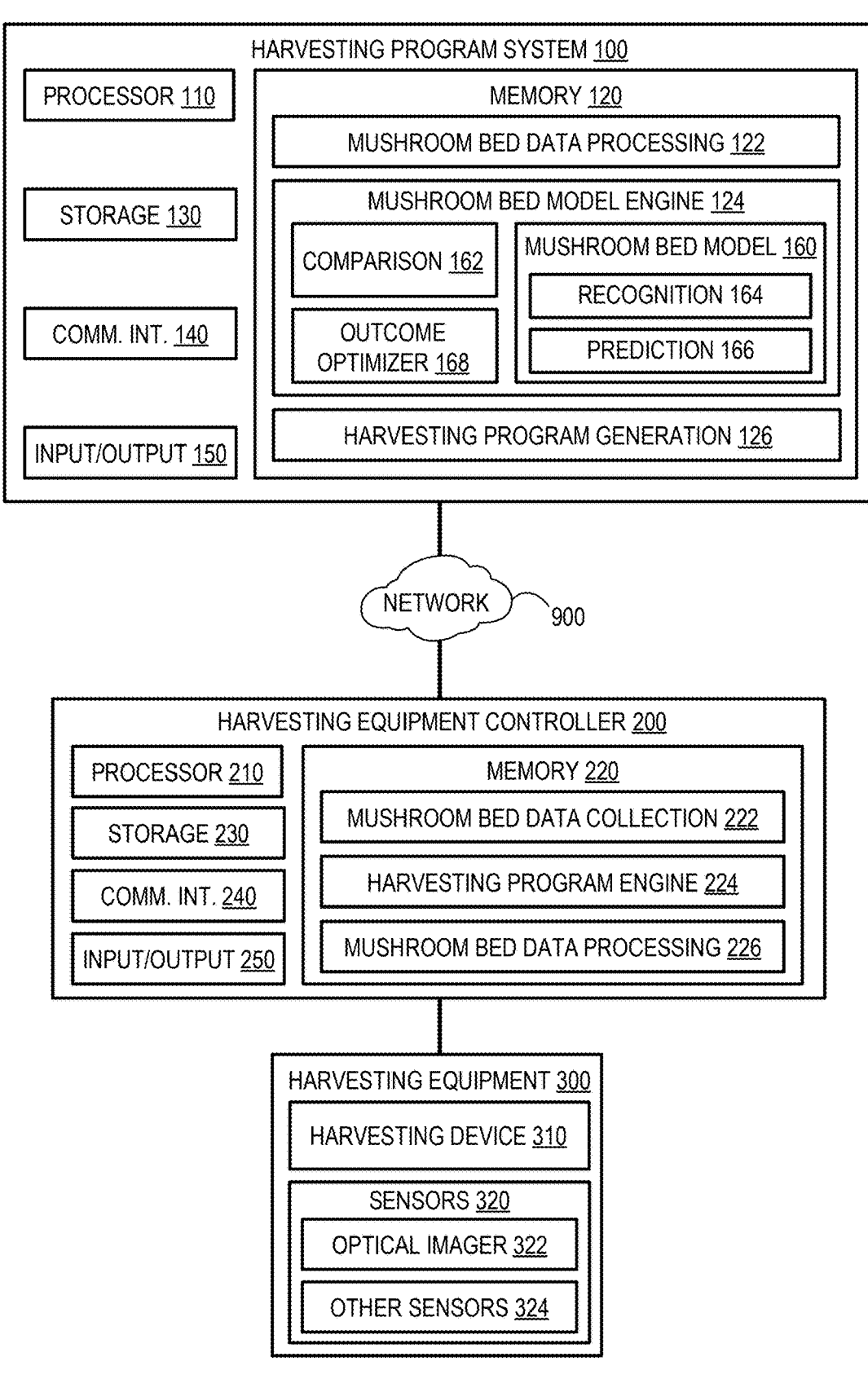
FIG. 1 shows a diagram of an automatic harvesting system.

It is to be understood that the accompanying drawings are used for illustrating the principles of the embodiments and exemplifications of the subject-matter discussed herein. Hence the drawings are illustrated for simplicity and clarity, and not necessarily drawn to scale and are not intended to be limiting in scope. Reference characters/numbers are used to depict the elements of the subject-matter discussed that are also shown in the drawings. The same corresponding reference characters/numbers are given to a corresponding component or components of the same or similar nature, which may be depicted in multiple drawings for clarity. In particular, specific embodiments or categories of embodiments of an element designated by a particular reference character may be distinguished by means of a suffix, wherein the specific embodiment designated by a reference character having a suffix is a species of the more general element having the same reference character lacking the suffix. For example, an element shown in the drawings and designated by the reference character ###n is a species of the more general element designated by reference character ###, and thus possesses all of the features of the more general element. Text may also be included in the drawings to further clarify certain principles or elements of the invention. It should be noted that features depicted by one drawing may be used in conjunction with or within other drawings or substitute features of other drawings. It should further be noted that common and well-understood elements for creating a commercially viable version of the embodiments discussed herein are often not depicted to facilitate a better view of the principles and elements of the subject-matter discussed herein. Throughout the drawings, sometimes only one or fewer than all of the instances of an element visible in the view are designated by a lead line and reference character, for the sake only of simplicity and to avoid clutter. It will be understood, however, that in such cases, in accordance with the corresponding description, that all other instances are likewise designated and encompassed by the corresponding description.

DESCRIPTION

Improved techniques for automatic cultivation and harvest of mushrooms are disclosed herein.

With reference to FIG. 1, an automatic harvesting system 000 may have a harvesting program system 100, a harvesting equipment controller 200, and harvesting equipment 300. The harvesting program system 100 may be communicatively coupled with the harvesting equipment controller 200 via a network 900. The harvesting equipment controller 200 may be operative to control the harvesting equipment 300 to perform a current harvesting program generated by and received from the harvesting program system 100. The harvesting program system 100 may generate a machine-learning-based model including the mushrooms growing in a growing bed (a 'mushroom bed model') and continuously or periodically train the model based on mushroom bed data collected by the harvesting equipment 300 while it performs the current harvesting program. The harvesting program system 100 may periodically regenerate a current harvesting program based on a current state of the mushroom bed model, and the harvesting equipment controller 200 may then receive and control the harvesting equipment 300 to perform the updated current harvesting program. In this way, the automatic harvesting system 000 may function to optimize a selected outcome predicted by the mushroom bed model, such as cumulative crop yield or cumulative production effectiveness, the latter taking into account both cumulative crop yield as well as other factors such as operations costs including energy costs.

The harvesting equipment controller 200 may have a processor 210, a memory 220, a storage 230, a communications interface 240, and input/output equipment 250. The memory 220 may store instructions operable by the processor 210 using the storage 230, the communications interface 240, and the input/output equipment 250 to perform the functions described herein. In particular, the memory 220 may store a mushroom bed data collection module 222 and a harvesting program engine 224. The memory may also store a mushroom bed data processing module 226. The harvesting equipment controller 200 may interface with the harvesting equipment 300 in order to communicate with and to control the harvesting equipment 300 as described herein.

The harvesting equipment 300 may have at least one harvesting device 310 and sensors 320. The sensors 320 may include at least an optical imager 322, and may also include one or more other sensors 324. The harvesting equipment controller 200 is operable to use the harvesting program engine 224 to control the harvesting equipment 300 to use the harvesting device 310 to perform a current harvesting program. At the same time, the harvesting equipment controller 200 is operable to use the mushroom bed data collection module 222 to use the sensors 320 to collect mushroom bed data, as described herein.

Figure 2:
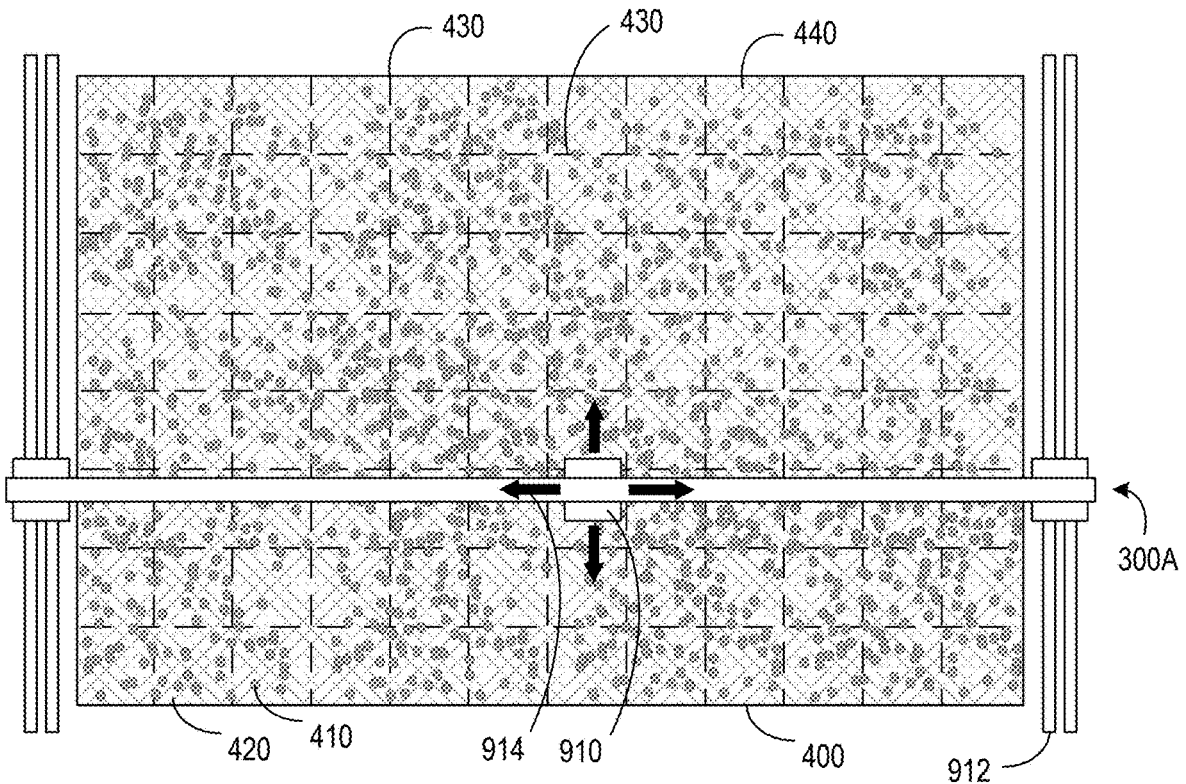
FIG. 2 shows a diagram of a mushroom bed and one embodiment of harvesting equipment.

With reference to FIG. 2, the harvesting equipment controller 200 is operative to control the harvesting equipment 300 relative to a mushroom bed 400 containing a number of mushrooms 410 (only one of which is identified by a reference character and lead line to avoid clutter) in a growing medium 420. The growing medium 420 may be of any suitable form or composition. For example, the growing medium 420 may include a casing soil, which may include a peat and lime mixture, layered atop a substrate, which may include a composted mixture of wheat straw, animal manure, and gypsum, which is pasteurized, inoculated, and colonized with spawn of a selected mushroom strain.

Any suitable harvesting equipment may be used so long as it possesses the characteristics and is operable to perform the functions described herein. One non-limiting embodiment of harvesting equipment 300 is shown in FIG. 2. In this embodiment, the harvesting equipment 300A is shown having a carriage 910 mounted on a track-and-rail positioning system 912 operative to selectively position the carriage 910 at any location above the mushroom bed 400, as illustrated by arrows 914. The harvesting device 310 and the sensors

320 may be provided at or proximal the carriage 910 facing the mushroom bed 400. In other embodiments, the harvesting equipment 300 includes a harvesting device 310 which is or includes a robotic arm having an end effector operable to harvest selected mushrooms from the mushroom bed 400. The arm is operable to position the end effector at any selected position above the mushroom bed 400. The harvesting device 310 may be or include the automated mushroom harvesting apparatus disclosed by Bourdeau et al. disclosed in WIPO International Publication Number WO 2023/010198 A1.

As noted above, the harvesting equipment controller 200 is operable to use the harvesting program engine 224 to control the harvesting equipment 300 to use the harvesting device 310 to perform a current harvesting program. The current harvesting program may include a sequence of actions to be performed by the harvesting device 310 in accordance with the current mushroom bed model. Without limitation, such actions may include: moving the harvesting device 310 to or above any location on the mushroom bed 400; harvesting a specific mushroom 410 at a particular location in the mushroom bed 400; and moving or otherwise disturbing the growing medium 420 at a particular location in the mushroom bed 400.

The sensors 320 may be mounted to or proximal the harvesting device 310 of the harvesting equipment 300 so as to be operable to sense the mushroom bed 400 at or about the current position of the harvesting device 310. In particular, the optical imager 322, which may be a digital camera, may be coupled to the harvesting equipment 300 adjacent or proximal the harvesting device 310 in such a way as to provide a field of view containing the harvesting device 310 and an area of the mushroom bed 400 in which the harvesting device 310 is operable to harvest mushrooms 410 in the field of view. FIG. 3 shows an image of a mushroom bed 400 with a number of growing mushrooms 410 in a growing medium 420. In this case, the harvesting device 310 includes the automated mushroom harvesting apparatus disclosed by Bourdeau et al. disclosed in WIPO International Publication Number WO 2023/010198 A1. The image was collected using a digital camera mounted to the roboting arm, the end effector is visible near the left edge of the image. As noted above, the sensors 320 may include other sensors 324, which may or may not be limited by field of view in this way. The other sensors 324 may include one or more of an air temperature sensor, an air humidity sensor, a motion sensor, an orientation sensor, a light sensor, a soil pH sensor, a soil moisture sensor, a soil temperature sensor, a soil nutrient sensor, a soil pest/insect sensor, and a soil pollution sensor.

The harvesting equipment controller 200 may be operable to collect using the sensors 320 a stream of data about the state and conditions of the mushroom bed 400 including the growing mushrooms 410 and optionally also the growing medium 420 (collectively, "mushroom bed data"). In particular, the harvesting equipment controller 200 may use the 322 optical imager to collect a continuous stream of images of the mushroom bed 400 in the field of view of the optical imager 322. The optical imager 322 may be operated to continuously collect images as the harvesting device 310 is continuously moved from position to position above the mushroom bed 400 while performing a current harvesting program. When included, the harvesting equipment controller 200 may be operable to collect using the other sensors 324 a stream of data about the state and conditions of the mushroom bed 400 corresponding to the nature of such other sensors 324. The continuous stream of images of the mushroom bed 400 collected in this way may be used by the mushroom bed model engine 124 to continuously or periodically train the mushroom bed model.

In particular, the mushroom bed data may include, quantify, or enable determination of one or more properties or characteristics of the mushroom bed 400, the growing mushrooms 410, and optionally the growing medium 420. A non-limiting list of such properties or characteristics of the mushrooms 410 includes: mushroom size; mushroom growth rate; defects; marks; shape; quality grade; and anomalies. When included, a non-limiting list of the properties or characteristics of the growing medium 420 includes: soil pH, soil moisture, soil temperature, soil nutrient, soil pest/insect, and soil pollution. The mushroom bed data may be position-aware, in that it is associated with (which may be in the form of metadata) a collection location on the mushroom bed 400 where the mushroom bed data was collected by the sensors 320. For example, the mushroom bed data may be indexed according to a virtual partitioning of the mushroom bed 400. For example, as shown in FIG. 2, the mushroom bed 400 may be divided by a set of gridlines 430 into a set of mushroom bed cells 440, and the mushroom bed data may be collected and indexed in accordance with the mushroom bed cells 440. Such mushroom bed cells 440 may have any appropriate size, shape, or dimensions. Any suitable alternative arrangement may be used, including for example, a hexagonal tiling arrangement. The mushroom bed data may also be time-aware, in that it is associated with (which may be in the form of metadata) a collection time at which the mushroom bed data was collected by the sensors 320. For example, when the mushroom bed data is or includes images of the mushroom bed 400, the images may be indexed, labelled, or otherwise associated with a location on the mushroom bed 400 where the image was collected by the optical imager 322, and may also be indexed, labelled, or otherwise associated with a time at which the image was collected by the optical imager 322. The position and/or the time may be generated by the harvesting equipment 300 itself and received by the harvesting equipment controller 200, or it may be generated by the harvesting equipment controller 200.

The sensors 320 may be operated to collect mushroom bed data in any desired time interval. For example, the sensors 320 may be operated to collect mushroom bed data every 1-1000 ms, although other time intervals are contemplated. The harvesting equipment controller 200 may receive raw mushroom bed data from sensors 320 using any communicative connection between the harvesting equipment controller 200 and the harvesting equipment 300. The connection may be a wired connection, a wireless connection, and may use the communications interface 240 to receive the raw mushroom bed data. The raw mushroom bed data may then be stored in the storage 230. The harvesting equipment controller 200 may use the communications interface 240 to transmit the raw mushroom bed data as the mushroom bed data to the harvesting program system 100 over the network 900. Alternatively, it may have and operate the mushroom bed data processing module 226 as part of a computer vision system to process the raw mushroom bed data into pre-processed mushroom bed data, which may also be stored in the storage 230. For example, the mushroom bed data processing module 226 may be operable to process images collected by the optical imager 322 to augment, enhance, colour-correct, convert, or compress such images, or to identify, parameterize, or otherwise any of the properties and characteristics described above. The harvesting equipment controller 200 may then use the communications interface 240 to send the pre-processed mushroom bed data as the mushroom bed data to the harvesting program system 100.

As indicated above, the harvesting program system 100 may be operable to receive the mushroom bed data from the harvesting equipment controller 200, which may be using the communications interface 140, and may be over the network 900. The mushroom bed data processing module 122 may be operable to receive the mushroom bed data and to generate therefrom transformed mushroom bed data configured for ingestion by the mushroom bed model engine 124. In some embodiments, the mushroom bed data processing module 122 further processes the mushroom bed data (whether it is the raw mushroom bed data or the pre-processed mushroom bed data) preliminary to or as part of the process of generating the transformed mushroom bed data. In particular, the transformed mushroom bed data generated by the mushroom bed data processing module 122 may include mushroom bed data vectors configured for ingestion by the mushroom bed model engine 124. The mushroom bed data vectors may include or enable determination of any quantifiable properties or characteristics of the mushroom bed, mushrooms, and optionally the growing medium, as described herein. When the mushroom bed data is or includes a stream images, including position-indexed and time-indexed images, as described herein, the mushroom bed data vectors may be or include the images in any suitable encoding, which may include or be labelled by, which may be by metadata, corresponding locations and times. Any suitable object-detection techniques or metrics may be used, which may include intersection-over-union similarity measures.

The mushroom bed model engine 124 may include instructions for training and operating at least one machine-learning-enable mushroom bed model 160 of the mushroom bed 400 including at least the mushrooms 410, and optionally the growing medium 420, which is operable or useful to predict a state, which may be a current state or a future state, of the mushroom bed 400, based on mushroom bed data vectors received from the mushroom bed data processing module 122.

In particular, the mushroom bed model engine 124 may be operable to train the mushroom bed model 160 in two respects. Firstly, the mushroom bed model engine 124 may be operable to train a mushroom bed recognition function 164 of the mushroom bed model 160 to optimize determination from received mushroom bed data of preconfigured properties and characteristics of the mushroom bed 400 including the mushrooms 410 and optionally the growing medium 420. As discussed above, the mushroom bed data may enable a determination of such properties or characteristics as mushroom size, mushroom growth rate, defects, marks, shape, quality grade, and anomalies, although further properties or characteristics are contemplated. When the collected mushroom bed data is or includes a stream of images, as described herein, the mushroom bed model 160 may be trained to generate and predict such properties or characteristics, as described further below. Secondly, the mushroom bed model engine 124 may be operable to train a mushroom bed prediction function 166 of the mushroom bed model 160 to optimize determination from received mushroom bed data of a future state of the mushroom bed 400 including the mushrooms 410 and optionally the growing medium 420, at a specified future time. Any appropriate future time may be specified, and may be from 1 second to 1 hour (3600 seconds). More distant future times are also contemplated. The mushroom bed model engine 124 may be operable to use the mushroom bed prediction function 166 to predict a plurality of future states of the mushroom bed 400 based on a specified corresponding plurality of proposed harvesting programs. In either case, the mushroom bed model 160 is operable to generate a predicted state of the mushroom bed, which may be a state at a specified present or future time, and which may be in the form of mushroom bed state vectors. The mushroom bed state vectors may include or quantify any of the properties and characteristics of the mushroom bed including mushrooms, and optionally growing medium, as described herein, including but not limited to mushroom size, location, growth rate, defects, marks, shape, quality grade, and anomalies.

Addressing the first aspect, the mushroom bed model engine 124 may operable to train the mushroom bed recognition function 164 of the mushroom bed model 160 by using a comparison module 162. In an initial training stage, the mushroom bed data processing module 122 may be used to generate mushroom bed data vectors based on mushroom bed data received as described herein, where the corresponding known mushroom bed state vectors encoding the properties and characteristics of the mushroom bed 400, including the mushrooms 410, and optionally the growth medium 420 are determined by an additional procedure. For example, the mushroom bed 400 may be an actual mushroom bed 400 with live, growing mushrooms 410 in a real growth medium 420, and the known mushroom bed state vectors encoding the properties and characteristics of the mushroom bed 400 may be determined manually, which may be by manual inspection. Alternatively, and with reference to FIG. 4 the mushroom bed 400 may a synthetic mushroom bed 400", with synthetic mushrooms 410", and optionally synthetic growth medium 420", fabricated purposefully to possess preconfigured mushroom bed state vectors encoding a predetermined variety of the mushroom bed (including mushroom) properties and characteristics. In any case, the mushroom bed data vectors so received and generated may include or be labelled with the known mushroom bed state vectors. The mushroom bed model 160 may then process such labelled mushroom bed data vectors using the comparison module 162 to determine differences between the known mushroom bed state vectors and the mushroom bed state vectors generated by the mushroom bed recognition function 164 of the mushroom bed model 160 based on the received mushroom bed data, to learn to predict the corresponding known mushroom bed state vectors, and thus the known mushroom bed state.

Addressing the second aspect, the mushroom bed model engine 124 may be operable to train the mushroom bed prediction function 166 of the mushroom bed model 160 also by using the comparison module 162. As discussed above, the harvesting program engine 224 of the harvesting equipment controller 200 may be operable to control the harvesting equipment 300 according to a current harvesting program received from the harvesting program generation module 126 of the harvesting program system 100. During performance of the current harvesting program, the harvesting program engine 224 may be operable to use the sensors 320 of the harvesting equipment 300 to periodically or continuously collect mushroom bed data from the mushroom bed. In particular, the optical imager 322 may be operable to collect a stream of images of the mushroom bed 400 in the field of view of the imager 322 as the harvesting device 310 and the optical imager 322 are moved to and between a sequence of locations on the mushroom bed 400 in accordance with the current harvesting program. At a preconfigured point, which may be a preconfigured time or once a preconfigured threshold measure of collected mushroom bed data is received by the harvesting program system 100, the harvesting program system 100 may be operable to use the mushroom bed model engine 124, and particularly the mushroom bed prediction function 166 of the mushroom bed model 160, to predict one or more future mushroom bed states at one or more corresponding future times, in the form of predicted mushroom bed state vectors associated with such future time or times, and to store these in the storage 130. Then, when the harvesting program system 100 later receives collected mushroom bed data associated with a time corresponding with the predicted mushroom state vectors stored in the storage 130 having the same time, or a time which is within a predetermined threshold of the time of the collected mushroom bed data, the mushroom bed model engine 124 may be operable to use the mushroom bed recognition function 164 of the mushroom bed model 160 to generate collected mushroom bed state vectors based on the collected mushroom bed data, and to use the comparison module 162 to compare these with the corresponding predicted mushroom bed state vectors stored in the storage 130 to determine differences between the collected mushroom bed state vectors and the predicted mushroom bed state vectors, to learn to predict the future mushroom bed state vectors, and thus the future mushroom bed state. In other words, the mushroom bed model engine 124 may be operable to use the mushroom bed model 160 to generate predicted future mushroom bed states based on a current state of the mushroom bed model 160 and a current harvesting program, and then once actual mushroom bed data is collected corresponding to the time of the prediction, to use the comparison module 162 to compare the predicted and actual mushroom bed states, and to use the determined differences to further train the mushroom bed model 160. These two aspects of the mushroom bed model 160—the mushroom bed recognition function 164 and the mushroom bed prediction 166—are described and shown as two distinct aspects, they may instead represent merely two conceptual aspects of the same functionality. For example, the mushroom bed model 160 may be operable in general to generate a predicted mushroom bed state based on a specified time, and that time may be either a current time or a future time. Thus, the mushroom bed recognition function 164 may represent operation of the mushroom bed model 160 to predict a mushroom bed state at a specified current time, and the mushroom bed prediction function 166 may represent operation of the mushroom bed model 160 to predict a mushroom bed state at a specified future time.

The mushroom bed model engine 124 may be operable to train the mushroom bed recognition function 164 and the mushroom bed prediction function 164 of the mushroom bed model 160 using any suitable techniques known in the art. A network architecture or topology may be established, and layers may be added which are associated with respective optimization functions, activation functions, and/or loss functions. One or more artificial neural networks may be used, and each may of any suitable type, including without limitation convolutional neural networks, recurrent neural networks, and deep learning neural networks. The mushroom bed recognition function 164 and the mushroom bed prediction function 166 may involve one or more of the same artificial neural networks, or may involve different artificial neural networks. The mushroom bed model 160 may include instructions using supervised or unsupervised machine learning, involving identifying and recognizing patterns in the mushroom bed data (in the form of the mushroom bed data vectors) to enable recognition and prediction of mushroom bed states of the mushroom bed. The mushroom bed data described herein may be used to train the artificial neural network may be encoded in any suitable manner, such as, without limitation, an N-dimensional tensor, a matrix, or an array. Training may be performed in any suitable manner, and may include iterative training using labeled training data as described herein. Training of the artificial neural network may involve parameters initialized to random values, which are changed with each iteration, using any appropriate algorithm, such as a gradient descent algorithm, to converge to predetermined values. Training of the artificial neural network may employ any appropriate statistical model, which may be a multinomial logistic regression model, a random forest model, a decision tree, a logistic regression model, or a gradient boosting model.

Thus, with reference to FIG. 5, in method 500 the mushroom bed model engine 124 may receive collected mushroom bed data (step 510) and further receive comparison mushroom bed state vectors associated with the mushroom bed data (step 520) as described herein. In particular, the comparison mushroom bed state vectors may quantify known or predetermined properties and characteristics of the mushroom bed at a same time as a time when the collected mushroom bed data was collected, or the comparison mushroom bed state vectors may quantify predicted mushroom bed state vectors having a time the same as a collection time when the collected mushroom bed data was collected. This may be done by any suitable means, including by accessing the comparison mushroom bed vectors stored in the storage 130 or by receiving the comparison mushroom bed vectors in association with the collected mushroom bed data, which may be in the form of labelled data, and which may be in the form of or employ metadata. The mushroom bed model engine 124 may then use the mushroom bed model 160 in a current state to generate modelled mushroom bed state vectors from the collected mushroom bed data vectors (step 530). The mushroom bed model engine 124 may then use the comparison module 162 to compute differences between the comparison mushroom bed state vectors and the modelled mushroom bed vectors generated by the mushroom bed model 160 (step 540). The mushroom bed model engine 124 may update the mushroom bed model 160, including one or more of its parameters, based on the computed differences, which may be done iteratively until a preconfigured statistical measure (such as, without limitation, least squares, root mean square) of the differences meets a predetermined threshold (step 550). Any suitable optimization algorithm, such as a gradient descent optimization algorithm, may be used to minimize the differences.

Figure 6:
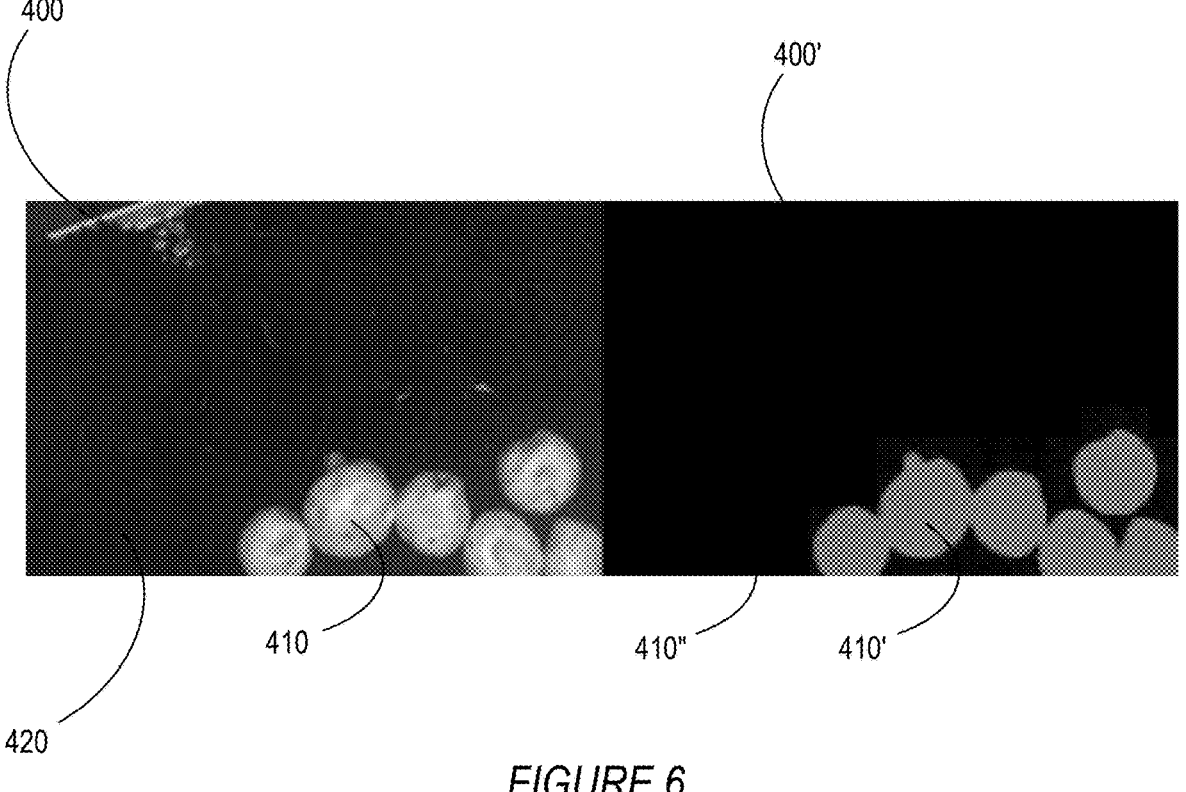
FIG. 6 shows images of an actual mushroom bed and a corresponding virtual mushroom bed.

Reference in this regard is made to FIG. 6, which shows two images side-by-side. The left-side image is a collected image of an actual mushroom bed 400 showing growing mushrooms 410 in a growing medium 420. The right-side image is a generated image of a virtual mushroom bed 400' generated from a mushroom bed model 160 of the mushroom bed 400 as described herein, showing virtual mushrooms 410'. In this way, the mushroom bed model 160 may be operable to generate a state of the virtual mushroom bed 400' at any specified time, which may be a future time, and in accordance with any specified conditions, and in this way predict the future state of the mushroom bed 400 and the mushrooms 410 therein at specified future times. In particular, the mushroom bed model 160 may be operable to generate the virtual mushroom bed 400' based on conditions determined by or related to a current harvesting program, and changes to be made to the mushroom bed 400 by the harvesting device 310 when the harvesting equipment 300 performs the current harvesting program. A non-limiting list of such conditions includes, in addition to the actions performed by the harvesting equipment 300 described above: initial seeding and success of germination, including seeding distribution; and current mushroom size distribution and density.

Moreover, the mushroom bed model engine 124 may further have an outcome optimizer module 168 operable to determine and select from amongst a plurality of proposed harvesting programs which optimally satisfies a preconfigured condition, such as a cumulative yield or a cumulative productivity effectiveness. In particular, the outcome optimizer module 168 may be operable to determine, based on a current state of the mushroom bed model 168, and in particular a plurality of predicted future states of the mushroom bed 400 determined using the mushroom bed prediction function 166 thereof as described above, a current optimal harvesting program to optimize the preconfigured condition, by using the mushroom bed prediction function 166 of the mushroom bed 160 to generate predicted mushroom beds at a plurality of future times for a plurality of proposed harvesting programs, generating further proposed harvesting programs based on an analysis of the predicted outcomes, which may be a regression analysis, and iterating until a predefined threshold is met, which may be a convergence threshold. Any suitable optimization algorithm, such as a gradient descent optimization algorithm, may be used. This may be done repeatedly based on the current mushroom bed data and different controllable conditions in order to model multiple different possible future virtual mushroom beds 400', and therefore predict the state of the mushroom bed 400 under such different controllable conditions. Such controllable conditions may include different harvesting programs, as described, and may also include different hypothetical variables, such as unanticipated events, incorrect environmental conditions, incorrect water conditions, incorrect nutrient conditions, and so forth. In this way, controllable conditions may be selected which optimize total crop yield or total operations effectiveness.

In this connection, the harvesting program generation module 126 may be operable to generate a current harvesting program based on a current state of the mushroom bed model 160, and in particular based on a current optimal future mushroom bed state determined by the outcome optimizer 168 of the mushroom bed model engine 124. The current harvesting program may include instructions operable by the harvesting equipment 300 using the harvesting device 310 to perform the current harvesting program. The current harvesting program may include instructions specifying a series of harvesting actions to be performed by the harvesting device 310, which may include, as noted above: moving the harvesting device 310 to or above any location on the mushroom bed 400; harvesting a specific mushroom 410 at a particular location in the mushroom bed 400; and moving or otherwise disturbing the growing medium 420 at a particular location in the mushroom bed 400. These and further actions may be performed by the harvesting device 310 in accordance with the current harvesting program to optimize total crop yield or total operations effectiveness, based on the current mushroom bed model 160. For example, the current harvesting program may, based on alternative outcomes predicted by the mushroom bed model 160, be configured to produce certain desired subsidiary outcomes, such as: a specific time at which to begin harvesting; avoiding or reducing overcrowding of mushrooms by pruning or otherwise changing the density of mushrooms at any location in the mushroom bed at a specific time to maximize or optimize mushroom growth; harvesting any particular mushroom at a specific time for ideal condition of that mushroom; and minimizing or optimizing an order of the harvesting of mushrooms with respect to minimizing or optimizing use of harvesting device resources (such as energy consumption and wear-and-tear) and/or to maximize or optimize mushroom condition at the time of harvest.

Thus, and with reference to FIG. 7, the automatic harvesting system 000 may perform method 600. Automated harvesting equipment may be used to perform a current harvesting program on a mushroom bed, the current harvesting program including a sequence of actions performable by the automated harvesting equipment to change a state of selected mushrooms, and optionally selected growth medium, at specified locations of the mushroom bed, and to collect mushroom bed data while performing the current harvesting program (step 610). The system 000 may then train a mushroom bed model based on a comparison between the current mushroom bed data and predicted mushroom bed states (step 620), and generate new predicted mushroom bed states using the trained mushroom bed model (step 630). The system 000 may then generate a new optimized outcome based on the new predicted mushroom bed states (step 640), and generate a new current harvesting program based on the new optimized outcome (step 650). The process may then repeat iteratively, until a predefined outcome or a preconfigured or predetermined condition is met.

Each of the harvesting program system 100 and the harvesting equipment controller 200 may include any computing and related communications and interface technology useful to perform the functions described herein. Such technology may include one or more computers, one or more servers, a group or groups of multiple servers, or one or mobile computing devices. Each of these may include or use further processing or communications technologies, which may include any number of processors and processor types, such as CPUs, one or more graphics processing units (GPUs), digital signal processors (DSPs), and so forth. In general, each such processor (including processors 110,210) is operable to execute or perform instructions stored in a memory, including memories 120,220, respectively. Such memory may include or interface persistent memories, such as storage 130,230. Each such processor may use any communications technology, including communications interfaces 140,240, which may include network interface controllers (NICs), which may be wired or wireless controllers, operable to perform communication over a network, including network 900, which may be or include the Internet. In particular, the harvesting program system 100 may include or be implemented in a cloud computing environment, including without limitation Amazon AWS™ or Microsoft Azure™.

The following are non-limiting embodiments of the disclosed subject-matter.

Embodiment 1. A harvesting program system comprising: at least one processor; and at least one computer-readable medium storing instructions executable by the at least one processor to cause the system: a) to receive current mushroom bed data corresponding to a mushroom bed including growing mushrooms at a current time; b) to process the current mushroom bed data using a mushroom bed model to generate a current virtual mushroom bed corresponding to a current state of the mushroom bed at the current time, wherein the mushroom bed model is trained: b.1) using labelled training mushroom bed data including known values of the mushroom bed; and b.2) using a previously-generated virtual mushroom bed corresponding to a predicted state of the mushroom bed at the current time; c) to generate using the mushroom bed model a predicted virtual mushroom bed corresponding to a predicted state of the mushroom bed at a future time; d) to generate a current harvesting program based on the predicted virtual mushroom bed; and e) to transmit the current harvesting program for automatic performance by harvesting equipment on the mushroom bed.

Embodiment 2. The harvesting program system of Embodiment 1, further comprising: periodically or continuously re-performing a) at a new current time; and periodically performing b), c), d), and e) based on the current mushroom bed data corresponding to the new current time.

Embodiment 3. The harvesting program system of Embodiment 1 or 2, wherein: b.2) comprises: comparing the current virtual mushroom bed corresponding to the current state of the mushroom bed at the current time with the previously-generated virtual mushroom bed corresponding to the predicted state of the mushroom bed at the current time to generate differences; and updating parameters of the mushroom bed model based on the differences.

Embodiment 4. The harvesting program system of any one of Embodiments 1 to 3, wherein: d) comprises: generating a plurality of proposed harvesting programs; for each of the proposed harvesting programs: using the mushroom bed model to generate a corresponding predicted virtual mushroom bed corresponding to the proposed harvesting program; and calculating a corresponding outcome based on the proposed harvesting program and the corresponding predicted virtual mushroom bed; and selecting as the current harvesting program the proposed harvesting program corresponding to the outcomes best matching predefined optimal outcome parameters.

Embodiment 5. An automatic harvesting system comprising: the harvesting program system of any one of Embodiments 1 to 4; harvesting equipment operable automatically to perform the current harvesting program on the mushroom bed and to collect the current mushroom bed data corresponding to the mushroom bed; and a harvesting equipment controller: connected to the harvesting equipment and operable automatically to cause the harvesting equipment to perform the current harvesting program on the mushroom bed and to collect the current mushroom bed data corresponding to the mushroom bed; and communicatively coupled to the harvesting program system to transmit automatically the current mushroom bed data to the harvesting program system and to receive automatically the current harvesting program.

Embodiment 6. The automatic harvesting system of Embodiment 5, wherein: the harvesting equipment comprises: a harvesting device operable to perform the current harvesting program; and sensors operable to collect the current mushroom bed data.

Embodiment 7. The automatic harvesting system of Embodiment 6, wherein: the current mushroom bed data comprises a stream of mushroom bed images; and the sensors comprise an optical imager operable to collect the stream of mushroom bed images.

Embodiment 8. The automatic harvesting system of Embodiment 7, wherein: the mushroom bed data comprises respective collection times of the mushroom bed images.

Embodiment 9. The automatic harvesting system of Embodiment 7 or 8, wherein: the mushroom bed data comprises respective collection locations of the mushroom bed images, wherein the collection locations designate corresponding locations on the mushroom bed of a field of view of the optical imager.

Embodiment 10. The automatic harvesting system of Embodiment 9, wherein: the current harvesting program comprises a sequence of actions performable by the harvesting device; each one of the actions comprises at least one of: moving the harvesting device to a destination location on the mushroom bed; harvesting a specific mushroom at a harvesting location in the mushroom bed; and moving or disturbing a growing medium at a corresponding location in the mushroom bed.

Embodiment 11. The automatic harvesting system of Embodiment 10, wherein: the harvesting equipment controller is operable automatically to control the optical imager to collect the stream of mushroom bed images while moving the harvesting device along a path from a first location in the mushroom bed to a second location in the mushroom bed; and the current mushroom bed data comprises images collected by the optical imager along the path between the first location and the second location.

Embodiment 12. The automatic harvesting system of Embodiment 11, wherein: the harvesting equipment controller is operable automatically to control the optical imager to collect the stream of mushroom bed images continuously while the harvesting device is in motion along the path from the first location in the mushroom bed to the second location in the mushroom bed.

Embodiment 13. A computer-implemented method for generating a harvesting program for automatically harvesting mushrooms from a mushroom bed, the method comprising: a) receiving current mushroom bed data corresponding to the mushroom bed including growing mushrooms at a current time; b) processing the current mushroom bed data using a mushroom bed model to generate a current virtual mushroom bed corresponding to a current state of the mushroom bed at the current time, wherein the mushroom bed model is trained: b.1) using labelled training mushroom bed data including known values of the mushroom bed; and b.2) using a previously-generated virtual mushroom bed corresponding to a predicted state of the mushroom bed at the current time; c) generating using the mushroom bed model a predicted virtual mushroom bed corresponding to a predicted state of the mushroom bed at a future time; d) generating a current harvesting program based on the predicted virtual mushroom bed; and e) transmitting the current harvesting program for automatic performance by harvesting equipment on the mushroom bed.

Embodiment 14. The computer-implemented method of Embodiment 13, further comprising: periodically or continuously re-performing a) at a new current time; and periodically performing b), c), d), and e) based on the current mushroom bed data corresponding to the new current time.

Embodiment 15. The computer-implemented method of Embodiment 13 or 14, wherein: b.2) comprises: comparing the current virtual mushroom bed corresponding to the current state of the mushroom bed at the current time with the previously-generated virtual mushroom bed corresponding to the predicted state of the mushroom bed at the current time to generate differences; and updating parameters of the mushroom bed model based on the differences.

Embodiment 16. The computer-implemented method of any one of Embodiments 13 to 15, wherein: d) comprises: generating a plurality of proposed harvesting programs; for each of the proposed harvesting programs: using the mushroom bed model to generate a corresponding predicted virtual mushroom bed corresponding to the proposed harvesting program; and calculating a corresponding outcome based on the proposed harvesting program and the corresponding predicted virtual mushroom bed; and selecting as the current harvesting program the proposed harvesting program corresponding to the outcomes best matching predefined optimal outcome parameters.

Embodiment 17. A computer-readable medium storing instructions operable by a processor to perform a method for generating a harvesting program for automatically harvesting mushrooms from a mushroom bed, the method comprising: a) receiving current mushroom bed data corresponding to the mushroom bed including growing mushrooms at a current time; b) processing the current mushroom bed data using a mushroom bed model to generate a current virtual mushroom bed corresponding to a current state of the mushroom bed at the current time, wherein the mushroom bed model is trained: b.1) using labelled training mushroom bed data including known values of the mushroom bed; and b.2) using a previously-generated virtual mushroom bed corresponding to a predicted state of the mushroom bed at the current time; c) generating using the mushroom bed model a predicted virtual mushroom bed corresponding to a predicted state of the mushroom bed at a future time; d) generating a current harvesting program based on the predicted virtual mushroom bed; and e) transmitting the current harvesting program for automatic performance by harvesting equipment on the mushroom bed.

Embodiment 18. The computer-readable medium of Embodiment 17, further comprising: periodically or continuously re-performing a) at a new current time; and periodically performing b), c), d), and e) based on the current mushroom bed data corresponding to the new current time.

Embodiment 19. The computer-readable medium of Embodiment 17 or 18, wherein: b.2) comprises: comparing the current virtual mushroom bed corresponding to the current state of the mushroom bed at the current time with the previously-generated virtual mushroom bed corresponding to the predicted state of the mushroom bed at the current time to generate differences; and updating parameters of the mushroom bed model based on the differences.

Embodiment 20. The computer-readable medium of any one of Embodiments 17 to 19, wherein: d) comprises: generating a plurality of proposed harvesting programs; for each of the proposed harvesting programs: using the mushroom bed model to generate a corresponding predicted virtual mushroom bed corresponding to the proposed harvesting program; and calculating a corresponding outcome based on the proposed harvesting program and the corresponding predicted virtual mushroom bed; and selecting as the current harvesting program the proposed harvesting program corresponding to the outcomes best matching predefined optimal outcome parameters.

So that the present disclosure may be more readily understood, certain terms are defined. Unless defined otherwise, all technical and scientific terms used herein have the same meaning as commonly understood by one of ordinary skill in the art to which embodiments of the invention pertain. While many methods and materials similar, modified, or equivalent to those described herein can be used in the practice of the embodiments of the present invention without undue experimentation, the preferred materials and methods are described herein.

All terminology used herein is for the purpose of describing particular embodiments only, and is not intended to be limiting in any manner or scope. For example, as used in this specification and the appended claims, the singular forms "a," "an" and "the" can include plural referents unless the content clearly indicates otherwise.

Numeric ranges recited within the specification are inclusive of the numbers defining the range and include each integer within the defined range. Throughout this disclosure, various aspects of this invention are presented in a range format. It should be understood that the description in range format is merely for convenience and brevity and should not be construed as an inflexible limitation on the scope of the invention. Accordingly, the description of a range should be considered to have specifically disclosed all the possible sub-ranges, fractions, and individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6, etc., as well as individual numbers within that range, for example, 1, 2, 3, 4, 5, and 6, and decimals and fractions, for example, 1.2, 3.8, 1½, and 4¾. This applies regardless of the breadth of the range.

The terms "about" or "approximately" as used herein refer to variation in the numerical quantity that can occur, for example, through typical measuring techniques and equipment, with respect to any quantifiable variable, including, but not limited to, mass, volume, time, distance, voltage, and current. Further, given solid and liquid handling procedures used in the real world, there is certain inadvertent error and variation that is likely through differences in the manufacture, source, or purity of the ingredients used to make the compositions or carry out the methods and the like. The terms "about" and "approximately" also encompass these variations. Expressions which combine the terms "about" or "approximately" with one or more bounds of a range refer to a union of the bound modified by the term "about" or "approximately" as described above, and the range having the unmodified bound. Thus, for example, the expression "at least about X" means the union of "at least X" and "about X". Similarly, "at most about Y" means the union of "at most Y" and "about Y".

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of", or when used in the claims, "consisting of" will refer to the inclusion of exactly one element of a number or list of elements. In general, the term "or" as used herein shall only be interpreted as indicating exclusive alternatives (i.e. "one or the other but not both") when preceded by terms of exclusivity, such as "either", "one of", "only one of", or "exactly one of". "Consisting essentially of", when used in the claims, shall have its ordinary meaning as used in the field of patent law.

Embodiments of the disclosed subject-matter are described herein using the auxiliary verb "may". When used herein, unless required otherwise by the context of usage, the auxiliary verb "may" designates an embodiment of the disclosed subject-matter which possesses the addressed object without requiring necessarily that any other embodiment of the disclosed subject-matter possesses the addressed object. Thus, a statement such as "X may include Y" indicates that the disclosed subject-matter includes embodiments where X includes Y, without requiring that all disclosed embodiments include Y, and without excluding any other embodiments which do not include Y.

While the disclosed subject-matter may be embodied in many different forms, there are described in detail herein specific embodiments. The present disclosure is an exemplification of the principles of the disclosed subject-matter and is not intended to limit the disclosed subject-matter to the particular embodiments illustrated. Furthermore, the disclosed subject-matter encompasses any possible combination of some or all of the various embodiments mentioned herein. In addition the disclosed subject-matter encompasses any possible combination that also specifically excludes any one or some of the various embodiments mentioned herein.

In some instances, well-known hardware and software components, modules, and functions are shown in block diagram form in order not to obscure the invention. For example, specific details are not provided as to whether the embodiments described herein are implemented as a software routine, hardware circuit, firmware, or a combination thereof.

Some of the embodiments described herein include a processor and a memory storing computer-readable instructions executable by the processor. In some embodiments, the processor is a hardware processor configured to perform a predefined set of basic operations in response to receiving a corresponding basic instruction selected from a predefined native instruction set of codes. Each of the modules defined herein may include a corresponding set of machine codes selected from the native instruction set, and which may be stored in the memory.

Embodiments can be implemented as a software product stored in a machine-readable medium (also referred to as a computer-readable medium, a processor-readable medium, or a computer usable medium having a computer-readable program code embodied therein). The machine-readable medium can be any suitable tangible medium, including magnetic, optical, or electrical storage medium including a diskette, optical disc, memory device (volatile or non-volatile), or similar storage mechanism. The machine-readable medium can contain various sets of instructions, code sequences, configuration information, or other data, which, when executed, cause a processor to perform steps in a method according to an embodiment of the invention. Those of ordinary skill in the art will appreciate that other instructions and operations necessary to implement the described embodiments can also be stored on the machine-readable medium. Software running from the machine-readable medium can interface with circuitry to perform the described tasks.

In the preceding description, for purposes of explanation, numerous details are set forth in order to provide a thorough understanding of the embodiments. However, it will be apparent to one skilled in the art that these specific details are not required. In particular, it will be appreciated that the various additional features shown in the drawings are generally optional unless specifically identified herein as required. The above-described embodiments are intended to be examples only. Alterations, modifications and variations can be effected to the particular embodiments by those of skill in the art. The scope of the claims should not be limited by the particular embodiments set forth herein, but should be construed in a manner consistent with the specification as a whole.

What is claimed is:

1. An automatic harvesting system comprising:
a harvesting program system comprising:
at least one processor; and
at least one computer-readable medium storing instructions executable by the at least one processor to cause the system to perform operations:
a) receiving current mushroom bed data corresponding to a mushroom bed including growing mushrooms at a current time;
b) processing the current mushroom bed data using a mushroom bed model to generate a current virtual mushroom bed corresponding to a current state of the mushroom bed at the current time, wherein the mushroom bed model is trained:
b.1) using labelled training mushroom bed data including known values of the mushroom bed; and
b.2) using a previously-generated virtual mushroom bed corresponding to a predicted state of the mushroom bed at the current time;
c) generating using the mushroom bed model a predicted virtual mushroom bed corresponding to a predicted state of the mushroom bed at a future time;
d) generating a current harvesting program based on the predicted virtual mushroom bed, comprising:
generating a plurality of proposed harvesting programs;
for each of the proposed harvesting programs:
using the mushroom bed model to generate a corresponding predicted virtual mushroom bed corresponding to the proposed harvesting program; and
calculating a corresponding outcome based on the proposed harvesting program and the corresponding predicted virtual mushroom bed; and
selecting as the current harvesting program the proposed harvesting program corresponding to the outcomes best matching predefined optimal outcome parameters; and
e) transmitting the current harvesting program for automatic performance by harvesting equipment on the mushroom bed;
harvesting equipment operable automatically to perform the current harvesting program on the mushroom bed and to collect the current mushroom bed data corresponding to the mushroom bed; and
a harvesting equipment controller:
connected to the harvesting equipment and operable automatically to cause the harvesting equipment to perform the current harvesting program on the mushroom bed and to collect the current mushroom bed data corresponding to the mushroom bed; and
communicatively coupled to the harvesting program system to transmit automatically the current mushroom bed data to the harvesting program system and to receive automatically the current harvesting program;
wherein:
the harvesting equipment comprises:
a harvesting device operable to perform the current harvesting program; and
sensors operable to collect the current mushroom bed data;
the current mushroom bed data comprises a stream of mushroom bed images; and
the sensors comprise an optical imager operable to collect the stream of mushroom bed images;
the mushroom bed data comprises respective collection locations of the mushroom bed images, wherein the collection locations designate corresponding locations on the mushroom bed of a field of view of the optical imager;
the harvesting equipment controller is operable automatically to control the optical imager to collect the stream of mushroom bed images while moving the harvesting device along a path from a first location in the mushroom bed to a second location in the mushroom bed;
the current mushroom bed data comprises images collected by the optical imager along the path between the first location and the second location; and
the harvesting equipment controller is operable automatically to control the optical imager to collect the stream of mushroom bed images continuously while the harvesting device is in motion along the path from the first location in the mushroom bed to the second location in the mushroom bed.

2. The automatic harvesting system of claim 1, wherein the operations further comprise:
periodically or continuously re-performing a) at a new current time; and
periodically performing b), c), d), and e) based on the current mushroom bed data corresponding to the new current time.

3. The automatic harvesting system of claim 1, wherein:
b.2) comprises:
comparing the current virtual mushroom bed corresponding to the current state of the mushroom bed at the current time with the previously-generated virtual mushroom bed corresponding to the predicted state of the mushroom bed at the current time to generate differences; and
updating parameters of the mushroom bed model based on the differences.

4. The automatic harvesting system of claim 1, wherein:
the mushroom bed data comprises respective collection times of the mushroom bed images.

5. The automatic harvesting system of claim 1, wherein:
the current harvesting program comprises a sequence of actions performable by the harvesting device;
each one of the actions comprises at least one of:
moving the harvesting device to a destination location on the mushroom bed;
harvesting a specific mushroom at a harvesting location in the mushroom bed; and
moving or disturbing a growing medium at a corresponding location in the mushroom bed.

6. The automatic harvesting system of claim 1, wherein:
the harvesting device comprises a robotic arm having an end effector operable to harvest a selected mushroom from the mushroom bed; and the optical imager comprises a digital camera mounted to the robotic arm having a field of view containing the end effector and an area of the mushroom bed at or about a current position of the end effector.

7. The automatic harvesting system of claim 1, wherein: the predefined optimal outcome parameters comprise maximum mushroom density.

8. The automatic harvesting system of claim 7, wherein: the current harvesting program comprises pruning a specific mushroom at a harvesting location in the mushroom bed to reduce a density of mushrooms at the harvesting location.

9. The automatic harvesting system of claim 1, wherein the operations further comprise:

automatically performing the current harvesting program on the mushroom bed using the harvesting equipment.

10. A computer-implemented method for performing a harvesting program for automatically harvesting mushrooms from a mushroom bed, the method comprising:

using a harvesting program system:
   a) receiving current mushroom bed data corresponding to the mushroom bed including growing mushrooms at a current time;
   b) processing the current mushroom bed data using a mushroom bed model to generate a current virtual mushroom bed corresponding to a current state of the mushroom bed at the current time, wherein the mushroom bed model is trained:
      b.1) using labelled training mushroom bed data including known values of the mushroom bed; and
      b.2) using a previously-generated virtual mushroom bed corresponding to a predicted state of the mushroom bed at the current time;
   c) generating using the mushroom bed model a predicted virtual mushroom bed corresponding to a predicted state of the mushroom bed at a future time;
   d) generating a current harvesting program based on the predicted virtual mushroom bed, comprising:
   generating a plurality of proposed harvesting programs;
   for each of the proposed harvesting programs:
      using the mushroom bed model to generate a corresponding predicted virtual mushroom bed corresponding to the proposed harvesting program; and
      calculating a corresponding outcome based on the proposed harvesting program and the corresponding predicted virtual mushroom bed; and
      selecting as the current harvesting program the proposed harvesting program corresponding to the outcomes best matching predefined optimal outcome parameters;
   e) transmitting the current harvesting program for automatic performance by harvesting equipment on the mushroom bed;
causing the harvesting equipment to automatically perform the current harvesting program on the mushroom bed and to collect the current mushroom bed data corresponding to the mushroom bed; and
using a harvesting equipment controller connected to the harvesting equipment and communicatively coupled to the harvesting program system:
   to automatically cause the harvesting equipment to perform the current harvesting program on the mushroom bed and to collect the current mushroom bed data corresponding to the mushroom bed; and
   to transmit automatically the current mushroom bed data to the harvesting program system and to receive automatically the current harvesting program;

wherein:
   the harvesting equipment comprises:
      a harvesting device operable to perform the current harvesting program; and
      sensors operable to collect the current mushroom bed data;
   the current mushroom bed data comprises a stream of mushroom bed images; and
   the sensors comprise an optical imager operable to collect the stream of mushroom bed images;
   the mushroom bed data comprises respective collection locations of the mushroom bed images, wherein the collection locations designate corresponding locations on the mushroom bed of a field of view of the optical imager;
   the harvesting equipment controller is operable automatically to control the optical imager to collect the stream of mushroom bed images while moving the harvesting device along a path from a first location in the mushroom bed to a second location in the mushroom bed;
   the current mushroom bed data comprises images collected by the optical imager along the path between the first location and the second location; and
   the harvesting equipment controller is operable automatically to control the optical imager to collect the stream of mushroom bed images continuously while the harvesting device is in motion along the path from the first location in the mushroom bed to the second location in the mushroom bed.

11. The computer-implemented method of claim 10, further comprising:
   periodically or continuously re-performing a) at a new current time; and
   periodically performing b), c), d), and e) based on the current mushroom bed data corresponding to the new current time.

12. The computer-implemented method of claim 10, wherein:
   b.2) comprises:
      comparing the current virtual mushroom bed corresponding to the current state of the mushroom bed at the current time with the previously-generated virtual mushroom bed corresponding to the predicted state of the mushroom bed at the current time to generate differences; and
      updating parameters of the mushroom bed model based on the differences.

13. The computer-implemented method of claim 10, wherein:
   the harvesting device comprises a robotic arm having an end effector operable to harvest a selected mushroom from the mushroom bed; and
   the optical imager comprises a digital camera mounted to the robotic arm having a field of view containing the end effector and an area of the mushroom bed at or about a current position of the end effector.

14. The computer-implemented method of claim 10, wherein:
   the predefined optimal outcome parameters comprise maximum mushroom density.

15. The computer-implemented method of claim 14, wherein:
   the current harvesting program comprises pruning a specific mushroom at a harvesting location in the mushroom bed to reduce a density of mushrooms at the harvesting location.

* * * * *